United States Patent [19]

Blank

[11] 4,165,410

[45] * Aug. 21, 1979

[54] MAGNETIC BUBBLE DEVICES WITH CONTROLLED TEMPERATURE CHARACTERISTICS

[75] Inventor: Stuart L. Blank, Madison, N.J.

[73] Assignee: Bell Telephone Laboratories, Incorporated, Murray Hill, N.J.

[ * ] Notice: The portion of the term of this patent subsequent to Jul. 5, 1994, has been disclaimed.

[21] Appl. No.: 803,069

[22] Filed: Jun. 3, 1977

[51] Int. Cl.[2] .......... H01F 1/37; G11B 5/68; G11C 11/02

[52] U.S. Cl. .......... 428/539; 252/62.57; 252/62.59; 252/62.63; 365/33; 428/900

[58] Field of Search .......... 252/62.51 R, 62.59, 252/62.63, 62.57; 365/33; 428/539, 900

[56] References Cited

U.S. PATENT DOCUMENTS

| | | | |
|---|---|---|---|
| 3,648,260 | 3/1972 | Gyorgy et al. | 365/33 |
| 3,665,427 | 5/1972 | Bobeck et al. | 365/33 |
| 3,693,177 | 9/1972 | Owens | 365/33 |
| 3,886,533 | 5/1975 | Bonner et al. | 252/62.57 X |
| 3,947,372 | 3/1976 | Shinagawa | 252/62.59 X |
| 4,002,803 | 1/1977 | Blank | 428/539 |
| 4,018,692 | 4/1977 | Akselrad et al. | 365/33 |
| 4,026,981 | 5/1977 | Metselaar et al. | 252/62.57 X |
| 4,034,358 | 7/1977 | Blank | 65/33 |

*Primary Examiner*—Harold Ansher
*Attorney, Agent, or Firm*—Allen N. Friedman

[57] ABSTRACT

The temperature variation of the bubble collapse field of a class of garnet magnetic bubble layer materials is selected by selection of the ratio PbO to $B_2O_3$ in the flux from which the layer is grown. This permits the growth of layers, whose temperature dependence of critical magnetic properties more closely match the temperature dependence of bias magnet materials, resulting in extended operating temperature range and/or wider operating margins (with attendant improvement in manufacturing yield). Layer growth at higher ratios of PbO to $B_2O_3$ produces films of higher rate of change of bubble collapse field with temperature.

3 Claims, 3 Drawing Figures

MAGNETIC BUBBLE DEVICES WITH CONTROLLED TEMPERATURE CHARACTERISTICS

BACKGROUND OF THE INVENTION

1. Field of the Invention

The invention is concerned with magnetic "bubble" devices. In particular, the invention is concerned with devices which include a supported layer of magnetic garnet material, generally, but not necessarily, on a non-magnetic garnet substrate. Such devices depend for their operation on nucleation and/or propagation of small enclosed magnetic domains of polarization opposite to that of the immediately surrounding material in the supported layer. These domains have come to be known as "magnetic bubbles". Functions which may be performed include switching, memory and logic.

2. Description of the Prior Art

A magnetic bubble is a magnetic domain characterized by a single domain wall which closes upon itself in the plane of a layer of magnetic material in which it can be moved. Inasmuch as the wall closes on itself, the domain is self-defined and is free to move anywhere in the plane. Domains of this type are disclosed in U.S. Pat. No. 3,460,112 of A. H. Bobeck et al. issued Aug. 5, 1969.

A layer of magnetic material in which bubbles can be moved typically includes an epitaxially grown single crystal film having a preferred direction of magnetization normal to the plane of the film. A domain in such a material is visualized as a right circular cylinder magnetically positive at the top surface of the layer and negative at the bottom forming a magnetic dipole along an axis normal to the plane of movement. When exposed to polarized light and viewed through an analyzer, a single wall domain appears as disk relatively dark or light, in contrast to the remainder of the layer (thus, the term magnetic bubble).

When a suitable layer of magnetic material is maintained in a bias field perpendicular to the layer, a bubble is stable over a range of bias fields, which corresponds to a (stability) range of diameters. This range of diameters varies from a maximun at which a bubble "strips out" (at low bias field) to a finite minimum at which the bubble collapses (at high bias field), a range in which the maximum and minimum diameters differ by a factor of about three. The upper end of the corresponding bias field range is termed the "bubble collapse field" and the lower end of the range is termed the "strip out field". To ensure the widest possible operating margins in a practical bubble device, a bias field is typically chosen to produce a characteristic diameter in the middle of a bias range, which corresponds to the stability range of diameters.

In much of the literature, it has been prescribed by those skilled in the art, that a layer of material suitable for the movement of single wall domains be characterized by properties which ensure a stability range of magnetic field which is ideally constant as a function of temperature over a practical temperature range and that the bias field be maintained at a preselected constant value. Inasmuch as the stability range of a layer of selected material varied, the operating margins were reduced. The properties of magnetic materials and the relationship of those properties to the stability range are discussed in the *Bell System Technical Journal,* Vol. 50, No. 3, March, 1971, at page 725 et seq., in an article by A. A. Thiele, entitled "Device Implications of the Theory of Cylindrical Magnetic Domains".

A modification of this device design concept, which has lead to extended operating temperature ranges is disclosed in U.S. Pat. No. 3,711,841, issued Jan. 16, 1973. This patent discloses the utility of temperature varying materials, if a bias magnet structure is used which produces a temperature varying bias field to approximately match the temperature variation of the material. However, to extend the range of utility of bubble devices it would be desirable to tailor the bubble material properties to better match the temperature variation of available and otherwise desirable bias magnet materials. This has been done by controlled octahedral substitution through control of the concentrations of constituent oxides in the melt (U.S. Pat. No. 4,002,803, issued Jan. 11, 1977 to S. L. Blank) and by control of Ge substitution by selection of growth temperature (copending application Ser. No. 607,378; filed Aug. 25, 1975 now U.S. Pat. No. 4,034,358). However, the crystal growth systems employed are quite complex so that additional degrees of freedom are desired in order to tailor material properties to ever more stringent device requirements.

SUMMARY OF THE INVENTION

The epitaxial growth of magnetic garnet films for use in magnetic bubble memories requires the precise selection of the constituents of the growth melt in order to meet critical requirements for ultimate device performance. One set of important device performance requirements relates to the operation of the memory over the desired temperature range. The invention described herein utilizes a method by which the temperature variation of bubble collapse field can be sensitively adjusted, during growth, to closely match the temperature variation of bias magnet materials, without requiring the addition of new species to the already complex growth melt. This method is based on the discovery that the rate of change of bubble collapse field with temperature can be varied, from layer to layer, by the selection of the relative amounts of PbO and $B_2O_3$ in the melt.

PbO and $B_2O_3$ are incorporated in the growth melt as a flux for solution of the various oxides which are constituents of the deposited garnet material. In the past the ratio of these materials was selected in order to provide, for example, the desired viscosity of the melt at the growth temperature. The discovery that the relative content of these two fluxing substances importantly influences the magnetic properties of the deposited garnet layer was previously unsuspected and provides the worker responsible for material preparation, with a new tool which he may use to tailor the garnet layer properties to the ultimate device requirements. In particular, it has been recognized (e.g., U.S. Pat. No. 4,002,803, issued Jan. 11, 1977) that the selection of the temperature variation of the layer bubble collapse field to match the temperature variation of the bias magnet extends the useful temperature range of device operation and/or results in improved manufacturing yield. The claimed invention relates particularly to this property of the grown garnet layer.

DETAILED DESCRIPTION OF THE INVENTION

1. Bubble Devices

Figure 1:
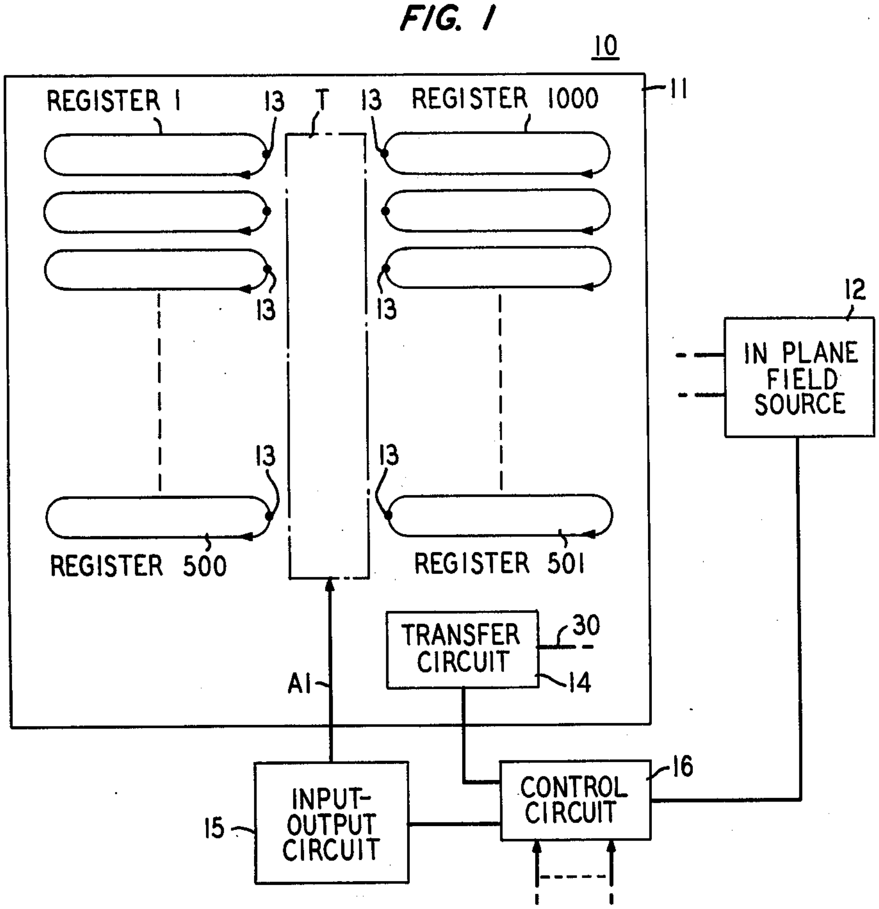
FIG. 1 is a schematic diagram of a recirculating memory in accordance with the invention.
Figure 2:
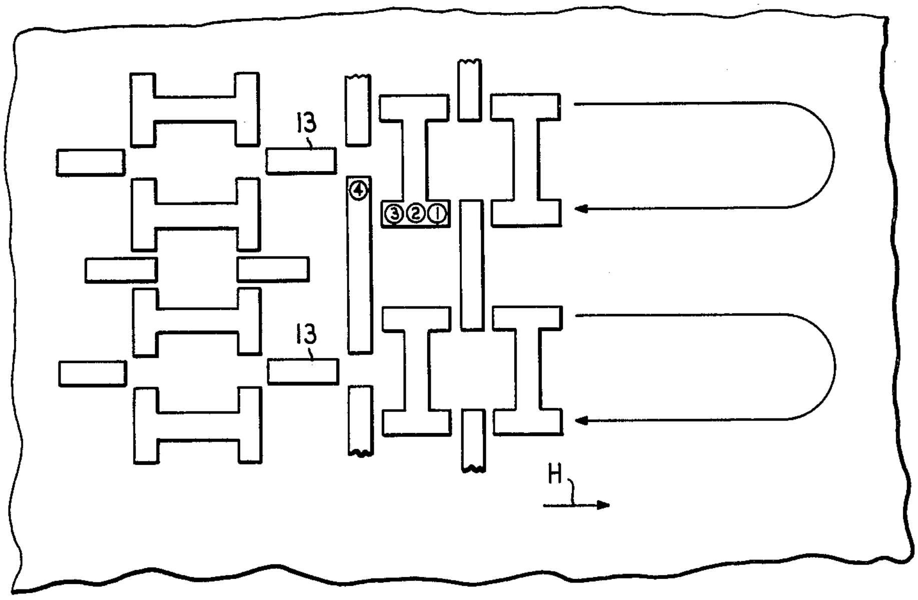
FIG. 2 is a detailed magnetic overlay for portions of the memory of FIG. 1 showing domain locations during operation.

The device of FIGS. 1 and 2 is illustrative of the class of "bubble" devices described in *IEEE Transactions on Magnetics,* Vol. *MAG*-5, No. 3, September 1969, pp. 544–553, in which switching, memory and logic functions depend upon the nucleation and propagation of enclosed, generally cylindrically shaped, magnetic domains having a polarization opposite to that of the immediately surrounding area (magnetic bubbles). Interest in such device centers, in large part, on the very high packing density so afforded, and it is expected that commercial devices with from $10^5$ and $10^7$ bit positions per square inch will be commercially available. The device of FIGS. 1 and 2 represents a somewhat advanced stage of development of the bubble devices and includes some details which have been utilized in recently operated devices.

FIG. 1 shows an arrangement 10 including a layer 11 of material in which single wall domains can be moved. The movement of domains, in accordance with this invention, is dictated by patterns of magetically soft overlay material in response to reorienting in-plane fields. For purposes of description, the overlays are bar and T-shaped segments and the reorienting in-plane field rotates clockwise in the plane of sheet 11 as viewed in FIGS. 1 and 2. The reorienting field source is represented by a block 12 in FIG. 1 and may comprise mutually orthogonal coil pairs (not shown) driven in quadrature, as is well understood. The overlay configuration is not shown in detail in FIG. 1. Rather, only closed "information" loops are shown in order to permit a simplified explanation of the basic organization in accordance with this invention unencumbered by the details of the implementation. We will return to an explanation of the implementation hereinafter.

The Figure shows a number of horizontal closed loops separated into right and left banks by a vertical closed loop as viewed. It is helpful to visualize information, i.e., domain patterns, circulating clockwise in each loop as an in-plane field rotates clockwise.

The movement of domain patterns simultaneously in all the registers represented by loops in FIG. 1 is synchronized by the in-plane field. To be specific, attention is directed to a location identified by the numeral 13 for each register in FIG. 1. Each rotation of the in-plane field advances a next consecutive bit (presence or absence of domain) to that location in each register. Also, the movement of bits in the vertical channel is synchronized with this movement.

In normal operation, the horizontal channels are occupied by domain patterns and the vertical channel is unoccupied. A binary word comprises a domain pattern which occupies simultaneously all the positions 13 in one or both banks, depending on the specific organization, at a given instance. It may be appreciated that a binary word so represented is fortunately situated for transfer into the vertical loop.

Transfer of a domain pattern to the vertical loop, of course, is precisely the function carried out initially for either a read or a write operation. The fact that information is always moving in a synchronized fashion permits parallel transfer of a selected word to the vertical channel by the simple expedient of tracking the number of rotations of the in-plane field and accomplishing parallel transfer of the selected word during the proper rotation.

The locus of the transfer function is indicated in FIG. 1 by the broken loop T encompassing the vertical channel. The operation results in the transfer of a domain pattern from (one or) both banks or registers into the vertical channel. A specific example of an information transfer of a one thousand bit word necessitates transfer from both banks. Transfer is under the control of a transfer circuit represented by block 14 in FIG. 1. The transfer circuit may be taken to include a shift register tracking circuit for controlling the transfer of a selected word from memory. The shift register, of course, may be defined in material 11.

Once transferred, information moves in the vertical channel to a read-write position represented by vertical arrow A1 connected to a read-write circuit represented by block 15 in FIG. 1. This movement occurs in response to consecutive rotations of the in-plane field synchronously with the clockwise movement of information in the parallel channels. A read or write operation is responsive to signals under the control of control circuit 16 of FIG. 1 and is discussed in some detail below.

The termination of either a write or a read operation similarly terminates in the transfer of a pattern of domains to the horizontal channel. Either operation necessitates the recirculation of information in the vertical loop to positions (13) where a transfer of operation moves the pattern from the vertical channel back into appropriate horizontal channels as described above. Once again, the information movement is always synchronized by the rotating field so that when transfer is carried out appropriate vacancies are available in the horizontal channels at positions (13) of FIG. 1 to accept information. For simplicity, the movement of only a single domain, representing a binary one, from a horizontal channel into the vertical channel is illustrated. The operation for all the channels is the same as is the movement of the absence of a domain representing a binary zero. FIG. 2 shows a portion of an overlay pattern defining a representative horizontal channel in which a domain is moved. In particular, the location 13 at which domain transfer occurs is noted.

The overlay pattern can be seen to contain repetitive segments. When the field is aligned with the long dimension of an overlay segment, it induces poles in the end portions of that segment. We will assume that the field is initially in an orientation as indicated by the arrow H in FIG. 2 and that positive poles attract domains. One cycle of the field may be thought of as comprising four phases and can be seen to move a domain consecutively to the positions designated by the encircled numerals 1, 2, 3, and 4 in FIG. 2, these positions being occupied by positive poles consecutively as the rotating field comes into alignment therewith. Of course, domain patterns in the channels correspond to repeat pattern of the overlay. That is to say, next adjacent bits are spaced one repeat pattern apart. Entire domain patterns representing consecutive binary words, accordingly, move consecutively to positions 13.

The particular starting position of FIG. 2 was chosen to avoid a description of normal domain propagation in response to rotating in-plane fields (considered unnecessary to this description). The consecutive positions from the right as viewed in FIG. 2 for a domain adjacent the vertical channel preparatory to a transfer operation are described. A domain in position 4 of FIG. 2 is ready to being its transfer cycle.

2. Composition

Garnets suitable for the practice of the invention are of the general stoichiometry of the prototypical compound $Y_3Fe_5O_{12}$. This is the classical yttrium iron garnet (YIG) which, in its unaltered form, is ferrimagnetic with net room temperature magnetic moment of $\sim$1750 gauss being due to the excess of one iron ion per formula unit in the tetrahedral sites over iron ions in the octahedral sites. In this prototypical compound, yttrium occupies a dodechedral site. The site names are chosen with respect to the geometric arrangement of nearest neighbor oxygen atoms surrounding the ion in the site (i.e., an octahedral site has six nearest neighbor oxygens forming an octahedron). The primary composition requirement, in accordance with the invention, is concerned with the nature of the ions, in part replacing iron in the octahedral sites, to control (i.e., preselect) the rate of change of the bubble collapse field with temperature. There is, of course, an attendant change in strip out field. These two fields determine the operating margin of the device. The difference between these two bias field values tends to remain approximately constant with temperature. The higher valued quantity, bubble collapse field, is easily determined and has been chosen as the characteristic quantity for the purpose of describing the invention.

The preferred compositions for operation of the invention can be represented by the formula:

$$R_{3-a}(Ca,Sr)_aGe_aFe_{5-a}O_{12}; \quad (1)$$

where R is at least one member of the group consisting of yttrium and the rare earth elements between members 57 and 71 of the Periodic Table of the Elements. In these compositions, germanium is included, primarily, as a tetrahedral site substituent, to reduce the total magnetic moment of the garnet to the desired range (e.g., approximately 300 gauss) in order to achieve the desired characteristic bubble size ($\sim$3 $\mu$meters). In the prototype compound (YIG) all of the cations are triply ionized, however germainium is quadruply ionized, therefore an equal amount of a divalent ion must be included for charge neutrality (valence balancing).

The general formula is expressed in terms of calcium or strontium as the divalent ion required for valence balancing of the tetravalent ion. Calcium is the most prevalent ion used for this purpose, and it is quite likely that compositions of the invention will utilize it alone for valence balancing. However, there are a number of other divalent or even monovalent ions that can also be utilized for valence balancing in whole or in part. For example, strontium, of somewhat larger ionic diameter than calcium, may be utilized in lieu of up to at least fifty percent of the calcium present. As with other variations in the formula, a general purpose for such replacement is to adjust the lattice parameter to more precisely match with respect to the substrate within tolerance limits.

The prototype garnet materials possess cubic symmetry, thus are ideally isotropic in magnetic properties. However, it is known that garnet materials may be made to deviate from their classic isotropic characteristics by either one or by a combination of two mechanism. The uniaxial anisotropy, perpendicular to the garnet layer, required to support magnetic bubble domains, can be produced by a strain induced mechanism or a growth induced mechanism. In the strain induced mechanism the bubble garnet layer is maintained under strain by a lattice mismatch between the layer and substrate. This strain produces a uniaxial magnetostriction effect. The growth induced anisotropy results from the preferential occupation of certain paramagnetic ions in certain of the dodechahedral sites during layer growth. In the preferred compositions the growth induced anisotropy is the predominant effect. This is mainly because the operation of the invention depends upon the sensitive control of the temperature variation of magnetic properties. Strain induced anisotropy tends to be quite sensitive to temperature, because of thermal expansion effects. Thus, octahedral site substitution is, in many cases relatively less effective in the control of the temperature variation of magnetic properties in garnets in which the strain induced mechanism predominates.

In Equation 1 "$R_{3-a}$" represents the dodecahedral site species which contribute to the magnetic properties of the garnet (i.e., aside from $(Ca,Sr)_a$ required for valence balancing). These are selected from the broad class of yttrium and the rare earth elements of the lanthanide series between atomic numbers 57 and 71 of the Periodic Table of the Elements. The selection of these species and their proportions are selected in accordance with principles well known in the art in order to achieve a number of desired magnetic properties in the layer with respect to contemplated device use (see, for example, J. W. Nielsen et al. *Journal of Electronic Materials,* 3 (1974) 693). These several material constraints include production of the desired degree of growth induced anisotropy, the desired lattice parameter, the desired total magnetic moment, and the desired bubble mobility.

Another property that is critical to the practical application of bubble devices is the bubble collapse field. For operation of bubble devices the bias field, desirably maintained by a permanent magnet structure, must maintain a closely controlled relationship with the bubble collapse field of the garnet material over the temperature range of operation of the device. Thus the relationship between the temperature variation of the bubble collapse field and the temperature variation of the permanent magnetic material is of primary importance in determining the operating temperature range of the magnetic bubble devices. It has been suggested (U.S. Pat. No. 3,711,841, issued Jan. 16, 1973) that the temperature range of operation of bubble devices can be broadened by using a bias magnet whose temperature variation of field approximately matches the temperature variation of bubble collapse field of the garnet material used. The herein disclosed invention relates to the extension of this idea by the sensitive adjustment of the temperature variation of bubble collapse field ($\Delta H_o$) of certain magnetic garnets to more closely match the temperature variation of permanent magnet materials. This permits the development of magnetic bubble devices intended for operation over even broader temperature ranges.

If operation over such temperature ranges is not necessary, use of the invention is still desirable because of an attendant broadening of operating margins. This broadening of operating margins can result in increased manufacturing yield of devices intended for use in more closely temperature controlled operating environments. Supported film growth, for best physical and compositional uniformity, is generally dependent upon procedures in which nucleation occurs simultaneously at many sites. Procedures which have been utilized include tipping, and immersion and extraction. Both of these procedures are flux growth procedures utilizing either a non-wetting flux containing boron oxide and lead oxide or a wetting flux containing boron oxide and bismuth oxide. To date, the most satisfactory procedure for supported growth epitaxial films is by super-cooled growth. Here a substrate is immersed in a supersaturated solution equivalent to super-cooling of at least 3 centrigrade degrees, and substrate together with grown film, are extracted after a short immersion period (see, for example 19, *Applied Physics Letters,* 486 (1971)).

Growth has generally been on gadolinium-gallium-garnet substrates (GGG). Growth procedures for this excellent substrate material are at a high level of development. The lattice parameter of GGG, 12.383 Angstroms, is within a range which permits either the extremely close matching desired for solely growth induced anisotropy or the still approximate matching for strain induced anisotropy. Work reported in the examples did utilize this substrate material. The substrate, however, plays no necessary active role in device performance; and any material permitting epitaxial film growth may be utilized.

The exemplary materials grown to illustrate the application of the inventive concept were grown by immersion of a gadolinium gallium garnet substrate in a super-cooled melt of the constituent oxides in a boron oxide-lead oxide flux. The melt composition, growth temperature and other growth conditions are selected in accordance with well recognized principles in order to produce the deposition of layers of the desired overall composition (S. L. Blank and J. W. Nielsen, *Journal of Crystal Growth* 17, 302 (1972); S. L. Blank, B. S. Hewitt, L. K. Shick and J. W. Nielsen, *AIP Conference Proceedings* 10, Part 1, Magnetism and Magnetic Materials, 1972, *American Institute of Physics,* New York 1973, p. 256).

The novel method claimed below rests on the discovery that the rate of change of bubble collapse field with temperature is significantly affected by the composition of the flux from which the layer is grown. A common fluxing system consists of a combination of PbO and $B_2O_3$. In the past the ratio of these two materials has been chosen to satisfy physical requirements of the growth melt (e.g., viscosity). However, the discovered influence of the ratio of lead to boron in the flux on the rate of change of bubble collapse field with temperature is shown in FIG. 3.

Figure 3:
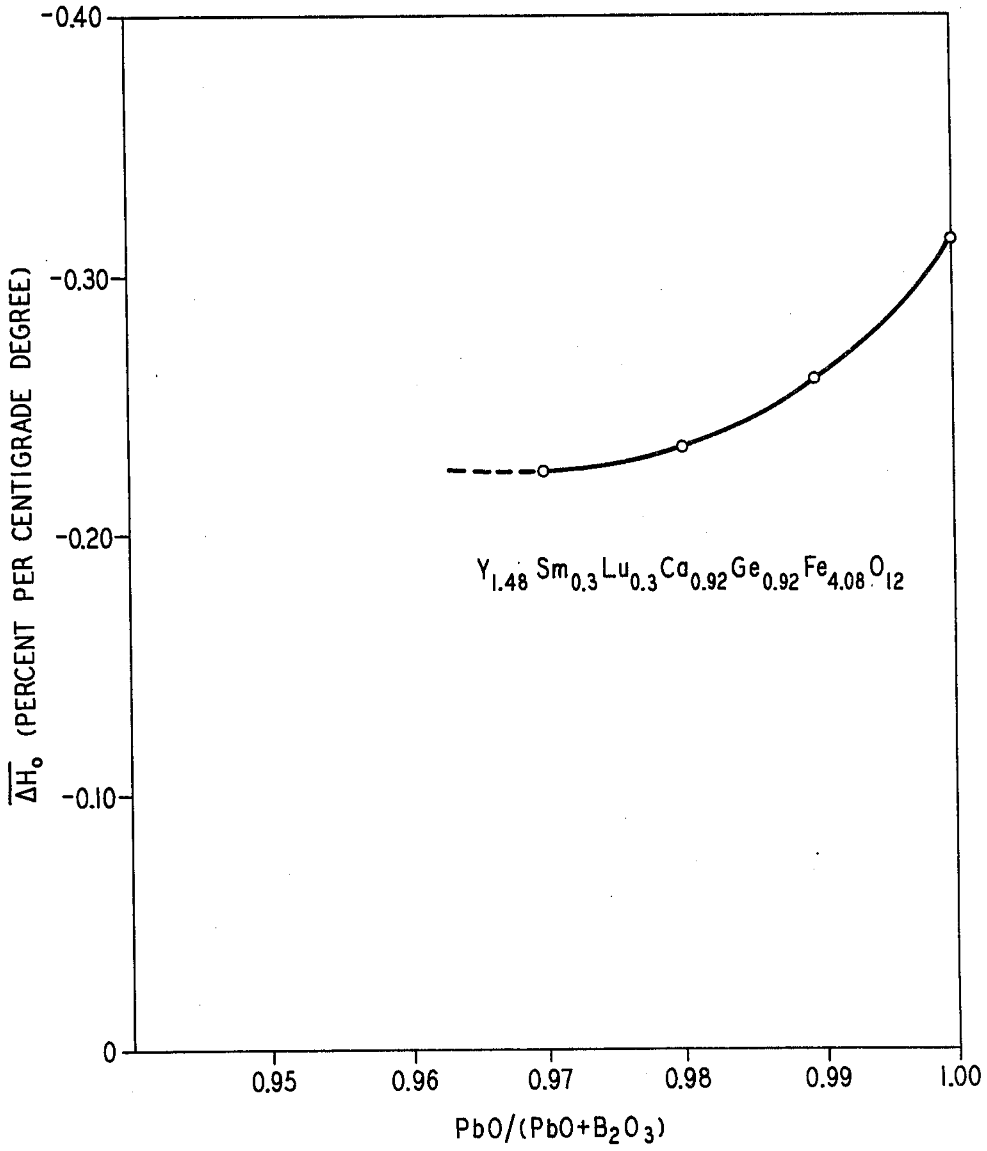
FIG. 3 is a plot of the normalized rate of change of bubble collapse field with temperature over the 0 degree to 100 degrees C range as a function of the flux composition (as a percent of the value at 50 degrees C).

FIG. 3 is a plot of the normalized rate of change of bubble collapse field between 0 degrees C. and 100 degrees C. (i.e., the average rate of change between 0 degrees C. and 100 degrees C. as a percent of the value at 50 degrees C.) as a function of the molar ratio of PbO to the total flux content ($PbO+B_2O_3$) for a material of nominal composition $Y_{1.48}Sm_{0.3}Lu_{0.92}Ge_{0.92}Fe_{4.08}O_{12}$. The relationship between this ratio and the weight ratio of PbO to $B_2O_3$ is shown in Table 1.

A similar influence, although less in magnitude, has been found in a substituted yttrium iron garnet ($Y_{2.08}Sm_{0.12}Ca_{0.8}Ge_{0.8}Fe_{4.2}O_{12}$) containing a much larger amount of yttrium relative to the other rare earth ion. The results of this set of measurements is shown in Table 2. For convenience a related quantity, Curie temperature, was measured.

It is believed that the above mentioned influence of flux composition on bubble collapse field is due to the complexing of the rare earth oxides in the melt by $B_2O_3$. A reduction of the $B_2O_3$ content, then, produces a greater concentration of rare earth ions (with respect to Iron) at the growth face and a resulting greater octahedral substitution of these materials in the garnet lattice. This effect is significant between ratios, by weight, of PbO to $B_2O_3$ from ten to infinity (pure PbO). More than one tenth by weight of $B_2O_3$ will produce no significant increase in complexing. As illustrated by its effect on yttrium, this control technique can be used for matching of temperature rate of change in the larger rare earth ions (i.e., Y and those rare earth elements from number 57 through number 68 of the Periodic Table of the Elements), which are more difficult to control by prior art means (e.g., those disclosed in U.S. Pat. No. 4,002,803 issued Jan. 31, 1977 and copending application Ser. No. 607,378, filed Aug. 25, 1975, now U.S. Pat. No. 4,034,358). The most sensitive control is achieved from weight ratio 60 to infinity.

TABLE 1

| $PbO/(PbO + B_2O_3)$ | $PbO/B_2O_3$ (weight ratio) |
|---|---|
| 0.97 | 33 |
| 0.98 | 50 |
| 0.99 | 100 |
| 0.995 | 200 |
| 1.00 | infinity |

TABLE 2

| $PbO/B_2O_3$ (weight ratio) | Curie Temperature (degrees Centigrade) |
|---|---|
| 50:1 | 473.3 |
| 200:1 | 469.1 |
| infinity | 465.1 |

EXAMPLES

1. A garnet layer of nominal composition $Y_{1.48}Sm_{0.3}Ca_{0.92}Ge_{0.92}Fe_{4.08}O_{12}$ was deposited on a substrate of gadolinum gallium garnet from a melt consisting of $Y_2O_3$-3.11 gm; $Sm_2O_3$-1.64 gm; $Lu_2O_3$-3.17 gm; $C_aO$-7.91 gm; $GeO_2$-16.38 gm; $Fe_2O_3$-148.05 gm; $B_2O_3$-17.15 gm; and PbO-1743.0 gm.

Growth took place at 925 degrees C. with a 12 degrees C. supersaturation. The film was suitable for bubble transport and stability and its bubble collapse field varied with temperature at a rate of approximately minus 0.27 percent per centigrade degree. The film composition is specified above as a nominal composition because, to the extent that there is octahedral substitution of rare earths, the iron content is reduced and the rare earth content increased.

2. The following compositions are bubble supporting materials containing only the larger rare earth ions, which are controlled by the selection of flux ratio (1) $Y_{1.9}Sm_{0.1}Ca_{1.0}Ge_{1.0}Fe_{4.0}O_{12}$;

(2) $Y_{2.62}Sm_{0.38}Ga_{1.17}Fe_{3.83}O_{12}$; and (3) $Y_{2.35}Eu_{0.65}Ga_{1.2}Fe_{3.8}O_{12}$.

What is claimed is:

1. A magnetic bubble device comprising (a) a substrate supporting at least a first layer of an iron containing garnet possessing an uniaxial magnetic anisotropy perpendicular to the layer, which layer is capable of supporting magnetic bubbles which are stable and of a characteristic diameter in a temperature varying bias field over a temperature range, which anisotropy is predominantly a growth induced anisotropy produced by dodecahedral site substitution, which bias field is produced by a magnet adapted for maintaining the layer in the bias field throughout the temperature range, which bias field is less than a bubble collapse field at each temperature within the temperature range and which bias field varies throughout the temperature range at an average variation rate (b) generating means for generating the bubbles; and (c) propagating means for moving the bubbles in order to produce information processing CHARACTERIZED IN THAT the iron garnet is of a composition represented by the atomic formula: $R_{3-a}(Ca,Sr)_aGe_aFe_{5-a}O_{12}$, where R is at least one member of the group consisting of yttrium and the rare earth elements, numbers 57 through 71 of the periodic table of the elements, which said iron garnet is epitaxially deposited from a solution of constituent oxides in a flux, which said flux consists essentially of PbO and $B_2O_3$ in a weight ratio selected from the range extending from ten to infinity; wherein the weight ratio is selected to produce the first layer of a garnet whose bubble collapse field varies with temperature throughout the temperature range, at approximately the said variation rate.

2. A device of claim 1 in which the weight ratio of PbO and $B_2O_3$ in the flux is from 60 to infinity.

3. A device of claim 2 in which the iron garnet contains at least one member of the group consisting of yttrium and those rare earth elements from number 57 through number 68 of the Periodic Table of the Elements.

* * * * *

UNITED STATES PATENT AND TRADEMARK OFFICE
CERTIFICATE OF CORRECTION

PATENT NO. : 4,165,410

DATED : August 21, 1979

INVENTOR(S) : Stuart L. Blank

It is certified that error appears in the above-identified patent and that said Letters Patent are hereby corrected as shown below:

Column 4, line 13 "or" should read --of--. Column 5, line 51, "germainium" should read --germanium--. Column 7, line 66, "$Y_{1.48}Sm_{0.3}Lu_{0.92}Ge_{0.92}Fe_{4.08}O_{12}$" should read --$Y_{1.48}Sm_{0.3}Lu_{0.3}Ca_{0.92}Ge_{0.92}Fe_{4.08}O_{12}$--. Column 8, line 50 "gadolinum" should read --gadolinium--.

Signed and Sealed this

*Eighteenth* Day of *March 1980*

[SEAL]

*Attest:*

SIDNEY A. DIAMOND

*Attesting Officer* *Commissioner of Patents and Trademarks*